United States Patent
Kaskel et al.

(10) Patent No.: US 11,545,654 B2
(45) Date of Patent: Jan. 3, 2023

(54) METHOD FOR PRODUCING A SUBSTRATE, WHICH IS COATED WITH AN ALKALI METAL, BY MEANS OF A PROMOTER LAYER, AND A COATED SUBSTRATE

(71) Applicants: FRAUNHOFER-GESELLSCHAFT ZUR FOERDERUNG DER ANGEWANDTEN FORSCHUNG E.V., Munich (DE); TECHNISCHE UNIVERSITAT DRESDEN, Dresden (DE)

(72) Inventors: Stefan Kaskel, Dresden (DE); Holger Althues, Dresden (DE); Benjamin Schumm, Dresden (DE); Nicolai Dresel, Dresden (DE); Kay Schoenherr, Dresden (DE)

(73) Assignees: FRAUNHOFER-GESELLSCHAFT ZUR FOERDERUNG DER ANGEWANDTEN FORSCHUNG E.V, Munich (DE); TECHNISCHE UNIVERSITÄT DRESDEN, Dresden (DE)

( * ) Notice: Subject to any disclaimer, the term of this patent is extended or adjusted under 35 U.S.C. 154(b) by 429 days.

(21) Appl. No.: 16/613,134

(22) PCT Filed: May 15, 2018

(86) PCT No.: PCT/EP2018/062458
§ 371 (c)(1),
(2) Date: Nov. 13, 2019

(87) PCT Pub. No.: WO2018/210791
PCT Pub. Date: Nov. 22, 2018

(65) Prior Publication Data
US 2020/0099039 A1    Mar. 26, 2020

(30) Foreign Application Priority Data

May 16, 2017 (DE) ...................... 10 2017 208.218.6

(51) Int. Cl.
*H01M 4/04* (2006.01)
*C23C 30/00* (2006.01)
(Continued)

(52) U.S. Cl.
CPC ......... *H01M 4/0404* (2013.01); *C23C 30/005* (2013.01); *H01M 4/366* (2013.01);
(Continued)

(58) Field of Classification Search
CPC .... H01M 4/0404; H01M 4/366; H01M 4/382; H01M 10/0525; H01M 2004/027;
(Continued)

(56) References Cited

U.S. PATENT DOCUMENTS

| | | | |
|---|---|---|---|
| 3,634,144 A | 1/1972 | Hanawalt et al. | |
| 2001/0041294 A1* | 11/2001 | Chu | H01M 4/0459 429/231.95 |

(Continued)

FOREIGN PATENT DOCUMENTS

| | | |
|---|---|---|
| DE | 69919712 | 2/2005 |
| EP | 2472647 | 7/2012 |

(Continued)

OTHER PUBLICATIONS

International Search Report dated Aug. 28, 2018.
German Office Action dated Jan. 11, 2018.

*Primary Examiner* — Brian K Talbot
(74) *Attorney, Agent, or Firm* — Jacobson Holman PLLC

(57) ABSTRACT

The present invention relates to a method for producing a substrate (2) which is coated with an alkali metal (1), in which method a promoter layer (3) which is composed of a (Continued)

material which reacts with the alkali metal (1) by at least partial chemical reduction of the promoter layer (3) is applied to a surface of the substrate (2) and a surface of the promoter layer (3) is acted on by an alkali metal (1) and then the alkali metal (1) is converted into the solid phase and a coating containing the alkali metal is formed.

5 Claims, 3 Drawing Sheets

(51) Int. Cl.

| | | |
|---|---|---|
| *H01M 4/36* | (2006.01) | |
| *H01M 4/38* | (2006.01) | |
| *H01M 10/0525* | (2010.01) | |
| *H01M 4/02* | (2006.01) | |
| *B05D 1/02* | (2006.01) | |
| *B05D 1/08* | (2006.01) | |
| *B05D 1/18* | (2006.01) | |
| *B05D 1/26* | (2006.01) | |
| *B05D 3/06* | (2006.01) | |
| *C23C 14/34* | (2006.01) | |
| *C23C 16/00* | (2006.01) | |

(52) U.S. Cl.
CPC ........ *H01M 4/382* (2013.01); *H01M 10/0525* (2013.01); *B05D 1/02* (2013.01); *B05D 1/08* (2013.01); *B05D 1/18* (2013.01); *B05D 1/26* (2013.01); *B05D 3/065* (2013.01); *C23C 14/34* (2013.01); *C23C 16/00* (2013.01); *H01M 2004/027* (2013.01)

(58) Field of Classification Search
CPC ... B05D 1/02; B05D 1/08; B05D 1/18; B05D 1/26; B05D 3/065; C23C 14/34; C23C 16/00
USPC .......................................................... 427/115
See application file for complete search history.

(56) References Cited

U.S. PATENT DOCUMENTS

| | | | |
|---|---|---|---|
| 2002/0086213 A1* | 7/2002 | Utsugi .................... | H01M 4/13 429/231.95 |
| 2004/0005504 A1* | 1/2004 | Kugai ..................... | H01B 1/10 423/303 |
| 2005/0089757 A1 | 4/2005 | Bannai et al. | |
| 2006/0051677 A1* | 3/2006 | Matsushima ........... | H01M 4/70 429/231.95 |
| 2011/0215280 A1* | 9/2011 | Obrovac ................. | H01M 4/62 252/521.2 |
| 2015/0343434 A1* | 12/2015 | Sambandan ............ | B01J 27/24 502/171 |
| 2016/0308218 A1* | 10/2016 | Ota ........................ | H01M 4/661 |
| 2017/0077553 A1* | 3/2017 | Hiraoka ................. | H01M 4/525 |
| 2017/0173893 A1* | 6/2017 | Li .......................... | H01M 4/505 |
| 2022/0285669 A1* | 9/2022 | Doherty ................. | H01G 11/86 |

FOREIGN PATENT DOCUMENTS

| | | |
|---|---|---|
| JP | 2009032597 | 2/2009 |
| WO | 2005/001157 | 1/2005 |

\* cited by examiner

METHOD FOR PRODUCING A SUBSTRATE, WHICH IS COATED WITH AN ALKALI METAL, BY MEANS OF A PROMOTER LAYER, AND A COATED SUBSTRATE

The present invention relates to a method for producing a substrate coated with an alkali metal, by means of a mediator layer, and to a mediator layer and also to a coated substrate.

There are a host of lithium-based battery technologies in which metallic lithium anodes represent a key to increased energy densities, as in the case, for example, of lithium-ion batteries, lithium-sulfur batteries, solid-state batteries or lithium-air batteries. The production technologies presently used, such as extrusion and rolling, for the required lithium foils having foil thicknesses of less than 50 μm and foil widths of greater 100 mm, are reaching limits dictated by the mechanical properties of the lithium, and there are therefore no processes available for producing rolled product having the stated dimensions, this being a barrier to the scaling-up of the battery technologies to larger cell formats.

In order to get to thin materials in spite of the poor mechanical stability of lithium, a thin lithium foil is laminated to a copper foil; however, this does not allow the desired thicknesses to be achieved. The deposition of metallic lithium on copper foil by a process of vapor deposition is described in the publication WO 2005/001157 A2, for example. The drawback of this method is that the resulting deposition rates are relatively low and also that not only the copper foil but also components of the system in the vicinity of the substrate become coated with lithium, so leading to considerable effort and cost for maintenance, repair, and cleaning of the system.

Similar drawbacks affect the electrochemical deposition of lithium. Because direct deposition of lithium from the melt is likewise not easily possible, owing to poor wetting of the copper foil or similar substrates because of the high surface tension of metal melts, the desired layer thicknesses cannot be obtained by this route either.

It was an object of the present invention, therefore, to propose a method which avoids the drawbacks stated, and with which, therefore, it becomes possible to deposit an alkali metal on large areas and low thicknesses.

This object is achieved in accordance with the invention by a method as claimed in the claims. Advantageous embodiments and developments are described in the dependent claims.

A method for producing a substrate coated with an alkali metal comprises a step wherein a mediator layer is applied to a surface of the substrate. The mediator layer is made of a material which reacts with the alkali metal by at least partial chemical reduction. A surface of the mediator layer is imposed with an alkali metal and subsequently the alkali metal is converted into the solid phase or solid aggregate state and a coating is formed with the alkali metal.

A mediator layer which reacts chemically and/or forms an alloy with the alkali metal by at least partial chemical reduction of the mediator layer allows the wettability of the substrate by the alkali metal to be improved, thus allowing even relatively large areas to be coated and/or relatively large layer thicknesses to be achieved. The alkali metal on application or imposition may be gaseous, liquid or solid. The mediator layer is applied typically from the gas phase or the liquid phase or as a solid. Following application of the alkali metal, the alkali metal may be converted into the solid phase or the solid aggregate state by a thermal reduction. The surface of the mediator layer is preferably wetted or contacted with the alkali metal at elevated temperature, particularly preferably at a melting temperature of the alkali metal to be applied.

The mediator layer may be formed from silicon, tin, antimony, aluminum, magnesium, bismuth or alloys of the stated chemical elements, or comprise the stated elements or alloy. These elements or alloys form an alloy preferably with an alkali metal such as lithium.

The mediator layer may be formed from a material which in contact with the alkali metal reacts to form a mediating interface or boundary layer, by reduction of an oxidic material, for example. The oxidic material is preferably formed from an oxide of silicon, tin, lead, aluminum, zinc, antimony, iron, nickel, copper, cobalt, manganese, titanium, chromium, vanadium and/or tungsten. The mediator layer typically reacts with the alkali metal to form a mediating boundary layer by at least partial reduction of the metal oxide.

It may be the case that the mediator layer is formed from a material which as a chemical reaction allows an intercalation (for example, in graphite) or an insertion (for example, in $LiMeO_2$) of the alkali metal, the formation of an alloy or a physical transformation (conversion) by reduction. Physical transformation by reduction takes place preferably as $Cu_2O + 2\,Li \rightarrow Li_2O + 2\,Cu$ or $NiO + 2\,Li \rightarrow Li_2O + Ni$.

The mediator layer is typically designed as $Cu_2O$ or NiO, since these can be readily reduced by liquid lithium. The mediator layer may also, however, be formed from lithium metal oxides (such as $LiCoO_2$, $LiNiO_2$, $LiFePO_4$, $LiMnO_2$, $Li_2Mn_3NiO_8$, $LiNiCoMnO_2$, $LiNiCoAlO_2$, $Li_4Ti_5O_{12}$ or derivatives thereof) or carbon in graphite form, since these materials permit not only intercalation but also insertion.

The mediator layer may be formed by thermal oxidation, gas phase coating processes, preferably sputtering and/or chemical vapor deposition (CVD), wet-chemical coating and/or heat treatment. In particular, thermal oxidation of a copper foil or nickel foil here enables rapid and efficient formation of the mediator layer.

The alkali metal is applied typically by laser melting, melting using a heating apparatus, knife coating, application using a slot die, spreading, spraying of alkali metal melts, dip coating, gas phase methods, thermal spraying, pressure rolling and/or lamination. The methods described allow the alkali metal to be liquefied or converted into a gaseous state and also to be applied with defined dimensions to the surface of the mediator layer. The mediator layer may, however, also be used in the context of deposition of the alkali metal from the gas phase, in a physical vapor deposition (PVD).

Typically the mediator layer is formed with a thickness of between 0.1 nm and 1000 nm, preferably between 1 nm and 500 nm, particularly preferably between 10 nm and 200 nm, in order to achieve sufficient coverage of the substrate for the subsequent application of the alkali metal.

The alkali metal is preferably lithium or sodium, since lithium in particular is used for battery applications, where thin layers are important. The substrate may be formed of copper, nickel, carbon fibers or polymers such as polyethylene, polypropylene or polyimide and/or may comprise the stated materials.

The substrate preferably is formed of copper or nickel and/or comprises copper or nickel, and the mediator layer is formed of copper oxide in the case of a copper substrate and of nickel oxide in the case of a nickel substrate.

The substrate is typically a nonporous solid. The substrate is preferably a thin planar foil having a thickness of less than 20 μm, particularly preferably having a thickness of less than 10 μm.

The thermal oxidation may be carried out over a period of not more than 2 minutes, preferably less than 1.5 minutes, particularly preferably less than 1 minute, in order to generate a sufficiently thick oxide layer with the maximum rapidity and efficiency.

A coated substrate produced by the method described therefore comprises a layer sequence of substrate-mediator layer-alkali metal layer. Prior to the application of the alkali metal layer, the substrate has the mediator layer, which is formed of a material that reacts chemically with the alkali metal. The coated substrate may therefore have the properties already described and in particular may be produced by the method described. The substrate described is typically used as anode in a battery cell.

Exemplary embodiments of the invention are represented in the drawings, and are explained below with reference to FIGS. 1 to 10.

In the figures

Figure 1:
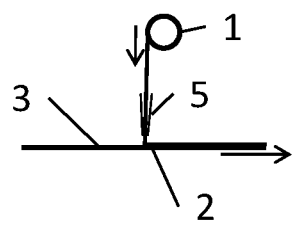
FIG. 1 shows a schematic side view of an alkali metal applied by heated nozzle.

FIG. 1 in a schematic side view shows a method for producing a substrate 2 coated with lithium as alkali metal 1. The substrate 2 in the exemplary embodiment represented is a copper foil which by thermal oxidation has been provided with a copper oxide layer as mediator layer 3. The mediator layer 3 is therefore in direct, i.e., immediate, contact with the substrate. The lithium is melted by means of a heated nozzle 5. The lithium foil is passed through the electrically heated nozzle 5 and is melted in the process. The substrate 2 is conveyed past flush below the nozzle 5, and the mediator layer 3 is disposed in turn on the substrate. The melted lithium, then, impinges on a surface of the mediator layer 3 that faces the nozzle 5, where it cools and goes back into a solid aggregate state, with the formation of an impervious lithium layer which is in direct contact with the mediator layer 3.

Figure 2:
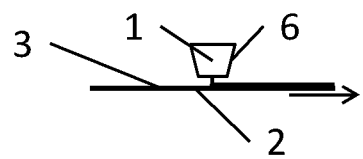
FIG. 2 shows a view corresponding to FIG. 1 of the alkali metal applied by heated reservoir.

As shown in FIG. 2, in a view corresponding to FIG. 1, a preferably electrically heated reservoir 6 is also able to accommodate liquefied lithium and apply the lithium to the mediator layer 3 by a slot die of the reservoir 6, this stop die facing the substrate 2. The reservoir 6 in this case has the form of a funnel, to allow targeted exit flow through the slot die. Recurring features in this figure and the following figures are given identical reference symbols.

Figure 3:
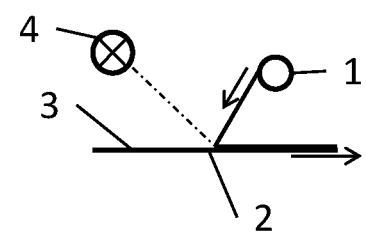
FIG. 3 shows a view corresponding to FIG. 1 of the alkali metal applied by laser melting.

In a further embodiment of the invention, which is represented in FIG. 3, a laser radiation source 4 directs electromagnetic laser radiation onto an impingement point of the foil-form lithium onto the substrate 2 or mediator layer 3, and so at this point the foil-form lithium is liquefied and is disposed on the substrate 2 by the copper oxide mediator layer 3.

Figure 4:
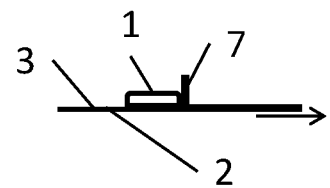
FIG. 4 shows a view corresponding to FIG. 1 of the alkali metal applied by knife coating.

In a further embodiment, which is reproduced in FIG. 4, the substrate 2 is heated and lithium as the alkali metal 1 lies as a melt on the substrate 2. By means of a coating knife 7, the lithium is scraped off with a defined thickness and applied to the mediator layer 3, which as before is facing a source of the alkali metal 1 to be applied.

Figure 5:
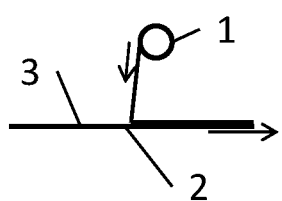
FIG. 5 shows a view corresponding to FIG. 1 of the alkali metal applied by spreading.

In the exemplary embodiment represented in FIG. 5, cold lithium foil is passed over a hot substrate 2. The substrate 2 in this case is passed through an electric oven and heated in the process. Spreading of the cold lithium foil over the substrate 2 causes the lithium foil to melt at the point of impingement on the mediator layer 3 applied to the substrate 2, and the melted lithium foil wets this mediator layer 3 superficially. After cooling, therefore, there is again an impervious lithium coating.

Figure 6:
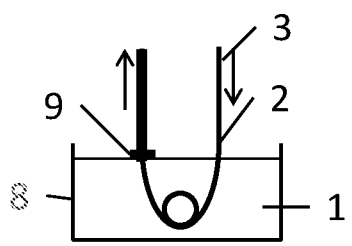
FIG. 6 shows a view corresponding to FIG. 1 of the alkali metal applied by dip.

FIG. 6 in turn, in a schematic side view, shows a heated tank 8 containing melted lithium. The substrate 2 with mediator layer 3 applied thereon is passed through the tank 8. On departure from the tank 8, it is possible to scrape off excess lithium at a scraper 9 and so to establish a layer of lithium on the substrate 2 that is identical in layer thickness on either side.

Figure 7:
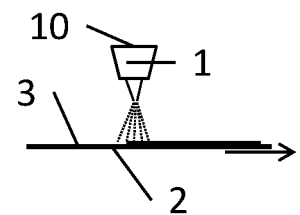
FIG. 7 shows a view corresponding to FIG. 1 of the alkali metal applied by spray.

FIG. 7 shows an exemplary embodiment wherein coating of the substrate 2 provided with the mediator layer 3 is accomplished by spray coating, where the alkali metal is deposited from a spraying nozzle 10 onto the substrate running past below the spraying nozzle 10.

Figure 8:
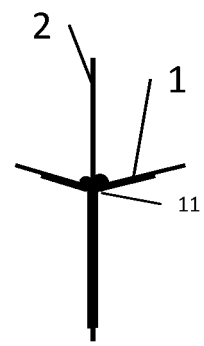
FIG. 8 shows a view corresponding to FIG. 1 of the alkali metal applied by continuous nozzle.

In the case of the exemplary embodiment reproduced in FIG. 8, the substrate 2 is coated on either side by the guiding of solid lithium to the substrate 2 from both sides. Because the substrate 2 is passed through a heated continuous nozzle 11 before the lithium impinges on the substrate 2 or on the mediator layer 3 disposed on either side of the substrate 2 and melts there, the substrate 2 is coated in such a way that an impervious lithium layer is formed.

Figure 9:
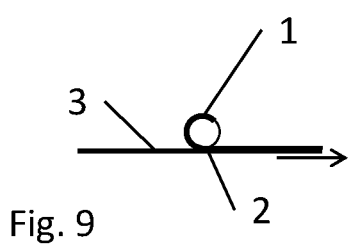
FIG. 9 shows a view corresponding to FIG. 1 of the alkali metal applied by pressure roll.

In a further exemplary embodiment, represented in FIG. 9, the substrate 2 is coated by a pressure roll method, by introduction of liquid lithium into surface indentations in a heated applicator roll and transport of the liquid lithium with the roll onto the substrate 2, where it impinges on the mediator layer 3 and is deposited.

Figure 10:
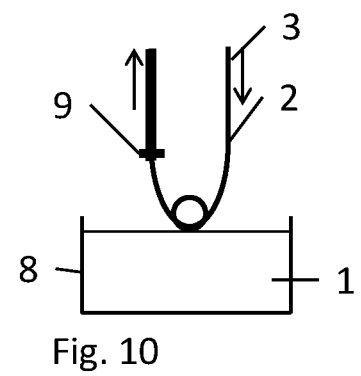
FIG. 10 shows a view corresponding to FIG. 1 of the alkali metal applied by glide.

In a further exemplary embodiment, which is represented in FIG. 10, the substrate 2 is coated by the uniform guiding of the substrate over a lithium melt bath, the substrate 2 being just in contact with the lithium surface. In this surface contact drawing, as it is called, the adjustment of layer thickness is accomplished by factors including the travel speed of the substrate 2. The coating width is undertaken by the width of the lithium melt bath, and hence, when using a foil whose width is greater than the lithium melt bath, an uncoated margin is produced.

The method described in various embodiments therefore enables extensive deposition of lithium on various substrates 2 by application of a lithiophilic mediator layer 3 which is thin—typically between 0.1 nm and 1000 nm in thickness. Examples of possible substrate materials used include copper foils, nickel foils, perforated metal foils, carbon fibers, especially carbon fiber mats, nonwoven webs made of carbon nanotubes (CNT nonwovens), woven metal wire fabrics, or polymeric substrates 2 such as polyimide films, woven polyimide fiber fabrics or laid polyimide fiber scrims.

The mediator layer 3 is formed of a material such as silicon, tin, antimony, aluminum, magnesium, bismuth or an alloy of the stated chemical elements such as CuSn that forms an alloy with lithium. Alternatively, the mediator layer 3 may also be made of a material which reacts in contact with liquid lithium to form a mediating interface—for example, which reacts by reduction of an oxidic material to form a material that forms alloys with lithium, such as aluminum oxide, for example. This may also be realized, for example, through materials which permit intercalation or insertion of lithium. These may in particular be materials which are employed as active materials in lithium-ion batteries, e.g., $LiCoO_2$, $LiNiO_2$, $LiFePO_4$, $LiMnO_2$, $Li_2Mn_3NiO_8$, $LiNiCoMnO_2$, $LiNiCoAlO_2$, $Li_4Ti_5O_{12}$ or carbon in graphite form. Alternatively, however, there may also be materials which in contact with liquid lithium react to give compounds which permit intercalation or insertion or other chemical reactions, examples being conversion materials, with which there is no intercalation or insertion but instead, for example, a metal oxide is converted directly (reversibly), vanadium oxide, manganese oxide, iron oxide, copper oxide, sulfur or sulfides. Instead of lithium, it is also possible analogously to utilize sodium for the formation of homologous layers from the melt. An example reaction of a conversion material may be as follows: $MeO + 2\,Li \rightarrow Me + Li_2O$.

Generally speaking, an oxidic mediator layer 3 which is at least partially (but also completely) reduced by lithium or sodium can be used. This oxidic mediator layer may therefore comprise a metal oxide, with oxides or oxide compounds of the following elements being suitable as the metal oxide: magnesium, aluminum, silicon, calcium, titanium, vanadium, chromium, manganese, iron, cobalt, nickel, copper, zinc, zirconium, molybdenum, indium, tin, antimony, lead, bismuth.

As for the application of the alkali metal 1, there are various possible procedures that can be employed to form the mediator layer 3. For example, a copper foil 12 μm in thickness can be surface-oxidized at 300° C. to 500° C. in a preheated muffle furnace (or in a high-temperature continuous oven for continuous substrates) to generate a thin oxide layer having a thickness of between 0.1 nm and 1000 nm, which serves as the mediator layer 3. In the same way, by oxidation of a nickel foil 20 μm in thickness, a nickel oxide mediator layer can be formed at 600° C. as well. The formation of $Cu_2O$ can be demonstrated by X-ray diffraction (XRD). Subsequently, in an Ar environment, solid lithium can be brought into contact with the oxidized cooper foil heated to 200° C., leading to the melting of the lithium. Then, as shown in FIG. 4, using the coating knife 7, a lithium layer with a thickness of 20 μm to 160 μm can be generated.

In the case of the exemplary embodiment described above, parameters of the method can also be adapted to the intended use. The copper foil is preferably treated at 300° C. for one minute, forming a $Cu_2O$ layer of approximately 10 nm in thickness that can be wetted very effectively by liquefied lithium. At 400-500° C., the treatment times are less than one minute, but different, less favorable copper oxides such as CuO are also formed.

In a variation of this exemplary embodiment, the mediator layer 3 is produced only in certain regions on the substrate 2. This enables the lithium layer to be imposed on the substrate 2 only in these regions, as well. Possible accordingly is the realization of patterned lithium layers and/or geometric shapes, or the generation of an uncoated marginal region for current collector tabs or the like.

In a further exemplary embodiment, a carbon fiber nonwoven (Freudenberg H14) can be impregnated for 30 s in an ethanolic $SnCl_2$ solution or $SbCl_3$ solution (0.15 M), dried for 5 minutes, and then heat-treated in air in a preheated muffle furnace at 300° C. for 5 minutes. After that, reduction is carried out in the absence of oxygen at 700° C. for 60 minutes. The substrate 2 produced in this way is subsequently dipped in a lithium melt.

In other exemplary embodiments, a woven copper fabric (wire thickness 0.05 mm, mesh size 0.2 mm) can also be treated under the same conditions as the copper foil and coated with lithium, or a rough copper foil is used, called an ED foil, bearing dendritic copper structures in the low single-digit μm range, through electrodeposition, converted in turn by thermal oxidation into a wettable state.

Whereas, for example, lithium beads are unsuitable for wetting on an untreated surface of a copper foil, the lithium beads can wet the foil surface in the case of a surface treated as described, on heating in argon to approximately 200° C. Accordingly it is possible to produce electrodes for secondary batteries such as lithium-ion batteries, lithium-air batteries, lithium-sulfur batteries or solid-state batteries or electrodes for primary batteries such as lithium-thionyl chloride batteries, lithium-manganese oxide batteries, lithium-sulfur oxide batteries, lithium-carbon monofluoride batteries, lithium-iodine batteries or lithium-iron sulfide batteries.

Features of the various embodiments that are disclosed only in the exemplary embodiments can be combined with one another and claimed individually.

The invention claimed is:

1. A method for producing a substrate formed from copper or nickel coated with a lithium layer, wherein
   a mediator layer comprising copper oxide on a surface of the substrate is chemically formed from copper or
   a mediator layer comprising nickel oxide on a surface of the substrate is chemically formed from nickel,
   a surface of the mediator layer is coated with liquid lithium and the mediator layer reacts with the liquid lithium by at least partial chemical reduction wherein the liquid lithium forms a solid phase lithium and a coating of the lithium is formed producing a lithium coated copper foil substrate or lithium coated nickel foil substrate.

2. The method as claimed in claim 1, wherein the mediator layer reacts when in contact with the lithium of the lithium coating to form a mediating interface or boundary layer.

3. The method as claimed in claim 1, wherein the mediator layer is formed by thermal oxidation, sputtering, chemical vapor deposition, wet-chemical coating or heat treatment.

4. The method as claimed in claim 1, wherein the lithium of the lithium layer is applied on the mediator layer by laser melting, melting using a heating apparatus, knife coating, application using a slot die, spraying, spreading, dip coating, thermal spraying or lamination.

5. The method as claimed in claim 1, wherein the mediator layer is formed with a thickness of between 0.1 nm and 1000 nm before coating with lithium.

* * * * *